United States Patent
Gardner et al.

(10) Patent No.: US 6,228,663 B1
(45) Date of Patent: *May 8, 2001

(54) METHOD OF FORMING SEMICONDUCTOR DEVICES USING GATE INSULATOR THICKNESS AND CHANNEL LENGTH FOR CONTROLLING DRIVE CURRENT STRENGTH

(75) Inventors: Mark I. Gardner, Cedar Creek; H. Jim Fulford; Anthony J. Toprac, both of Austin, all of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/994,107

(22) Filed: Dec. 19, 1997

(51) Int. Cl.[7] .................... H01L 21/336; H01L 21/8234; H01L 21/66; G01R 31/26

(52) U.S. Cl. .............. 438/14; 438/197; 438/275; 438/117; 438/438; 438/945; 148/DIG. 162; 257/327

(58) Field of Search ................ 438/14, 17, 197, 438/275, 16, 117, 585, FOR 177, FOR 193, FOR 141, FOR 142, 945; 148/DIG. 162; 257/327

(56) References Cited

U.S. PATENT DOCUMENTS

| 4,957,877 | * | 9/1990 | Tam et al. ............ 438/275 |
| 4,960,675 | * | 10/1990 | Tsuo et al. ........... 438/945 |
| 5,663,076 | * | 9/1997 | Rostoker et al. ...... 438/14 |
| 5,822,241 | * | 10/1998 | Chatterjee et al. ... 257/327 |
| 5,943,550 | * | 8/1999 | Fulford, Jr. et al. .. 438/14 |

* cited by examiner

Primary Examiner—Olik Chaudhuri
Assistant Examiner—Howard Weiss

(57) ABSTRACT

A semiconductor device having a controlled drive current strength is produced by varying gate electrode length to accommodate any variation in insulating layer thickness from a desired value. After formation of the gate insulating layer on a substrate, the thickness is measured and compared to a desired value. Based on any differences between the measured and desired values, the length of the gate electrode is determined in order to counteract the variation in gate insulating layer thickness. This results in a change in channel length that counteracts the effect of the variation in insulating layer thickness on the drive current strength. The present process permits close control over the drive current strength of semiconductor devices. This also can provide decreased variation within and between lots and corresponding increases in productivity.

13 Claims, 2 Drawing Sheets

METHOD OF FORMING SEMICONDUCTOR DEVICES USING GATE INSULATOR THICKNESS AND CHANNEL LENGTH FOR CONTROLLING DRIVE CURRENT STRENGTH

FIELD OF THE INVENTION

The present invention is generally directed to the manufacture of semiconductor devices. More particularly, the invention is directed to the manufacture of semiconductor devices in which the drive current strength of the final product can be controlled based on gate insulator thickness and channel length.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicabilities and numerous disciplines. An example of such a silicon-based semiconductor device is a metal-oxide-semiconductor (MOS) transistor. The principle elements of a typical MOS semiconductor device are illustrated in FIG. 1. The device generally includes a gate electrode 101, which acts as a conductor, to which an input signal typically is applied via a gate terminal (not shown). Heavily doped source region 103 and drain region 105 are formed in a semiconductor substrate 107, and respectively are connected to source and drain terminals (not shown).

A channel region 109 is formed in the semiconductor substrate 107 beneath the gate electrode 101 and separates the source region 103 and drain region 105. The channel typically is lightly doped with a dopant of a type opposite to that of the source and drain regions. The gate electrode 101 is physically separated from the semiconductor substrate 107 by a gate insulating layer 111. Typically, this insulating layer is an oxide layer such as $SiO_2$. The insulating layer 111 is provided to prevent current from flowing between the gate electrode 101 and the semiconductor source region 103, drain region 105 or channel region 109.

In operation, an output voltage typically is developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner, an electric field controls the current flow through the channel region 109. This type of device commonly is referred to as a MOS field-effect transistor (MOSFET). Semiconductor devices such as the one described are used in large numbers to construct most modern electronic devices. In order to increase the capability of such electronic devices, it is necessary to integrate ever larger numbers of such devices into a single silicon wafer. As the semiconductor devices are scaled down in order to form a larger number of such devices on a given surface area, the structure of the devices and the fabrication techniques used to make the devices must be altered.

One important property of MOS devices is drive current strength. It is particularly important to provide semiconductor devices that exhibit the designed drive current strength and to maintain a substantially constant drive current strength between production lots and within a single production lot.

The drive current strength is proportional to capacitance, which in turn is inversely proportional to the thickness of the gate insulating layer. The drive current strength also is inversely proportional to channel length. As the dimensions of semiconductor devices become smaller and smaller, production variations in gate insulating layer thickness have an increased significance with respect to variation in drive current strength.

SUMMARY OF THE INVENTION

Generally, the present invention relates to a method of producing a semiconductor device with controlled drive current strength. Consistent with the present invention, a semiconductor device is formed by forming a gate insulating layer over a substrate. The thickness of the gate insulating layer is measured and compared to a desired design thickness. A gate electrode is formed over the gate insulating layer. The length of the gate electrode is determined, based on the difference between the measured and designed thickness of the gate insulating layer. Thus, the length of the gate electrode, which determines the channel length for the semiconductor device, can be varied to take into account the variation in gate insulating layer thickness from the desired value. This allows the drive current strength of the final semiconductor device to be controlled. This also permits the reduction of variations in drive current strength within and between lots of the semiconductor devices. Current gate electrode formation techniques are sufficiently precise to permit the gate electrode to be formed in the desired length and remedy any variations in the insulating layer thickness.

The above summary of the present invention is not intended to describe each illustrated embodiment or every implementation of the present invention. The figures and detailed description that follow describe the embodiments more particularly.

BRIEF DESCRIPTION OF THE DRAWINGS

The present invention may understood more completely in consideration of the following detailed description of the various embodiments of the invention in connection with the accompanying drawings, in which.

Figure 1:
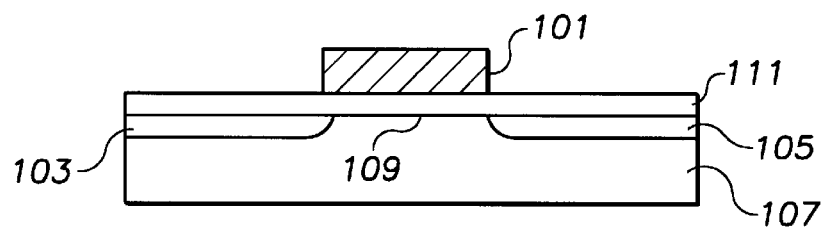
FIG. 1 illustrates the components of a typical MOS semiconductor device.

The invention is amenable to various modifications and alternative forms, and the specifics of the present invention have been shown only by way of example in the drawings, and will be described in detail. It should be understood that the intention is not to limit the invention to the particular embodiments described. On the contrary, the intention is to cover all modifications, equivalents and alternatives following the spirit and the scope of the invention as defined by the appended claims.

DETAILED DESCRIPTION OF THE VARIOUS EMBODIMENTS

The present invention is applicable to a variety of semiconductor devices, for example MOS devices such as an NMOS, PMOS, CMOS or BiCMOS device. While the present invention is not so limited, an understanding of the various aspects of the invention is best gained through a discussion of various application examples of the processes used to form the devices.

The present invention utilizes the relationship between insulating gate thickness and channel length (which in turn can be controlled by the gate electrode length) with respect to drive current strength to control the drive current strengths of semiconductor devices. The present invention typically will permit the drive current strength to be controlled, for example, to within about plus or minus 30 $\mu a/\mu m$, and the variation in drive current strength within and between lots also can be controlled to this tolerance. Typical drive current strengths are generally in the range of, for example, about 200–1000 $\mu a/\mu m$.

The drive current strength that is controlled may be, for example, the source-drain current, the effective drive current or the off-state drive current, or any combination of these. The effective drive current $Id_{eff}$ of a transistor may, for example, be determined using well-known techniques, such as measuring the source-drain current of the transistor while applying a known voltage to the gate and the drain, and grounding the source of the transistor, and dividing the source-drain current by the transistor width. The transistor width may, for example, be the length of the polysilicon gate electrode over its respective active area. The off-state current $Id_{off}$ of a transistor may, for example, be determined using well-known techniques, such as measuring the source-drain current of the transistor while applying a known voltage to the drain of the transistor and grounding the gate and source of the transistor.

Figure 2:
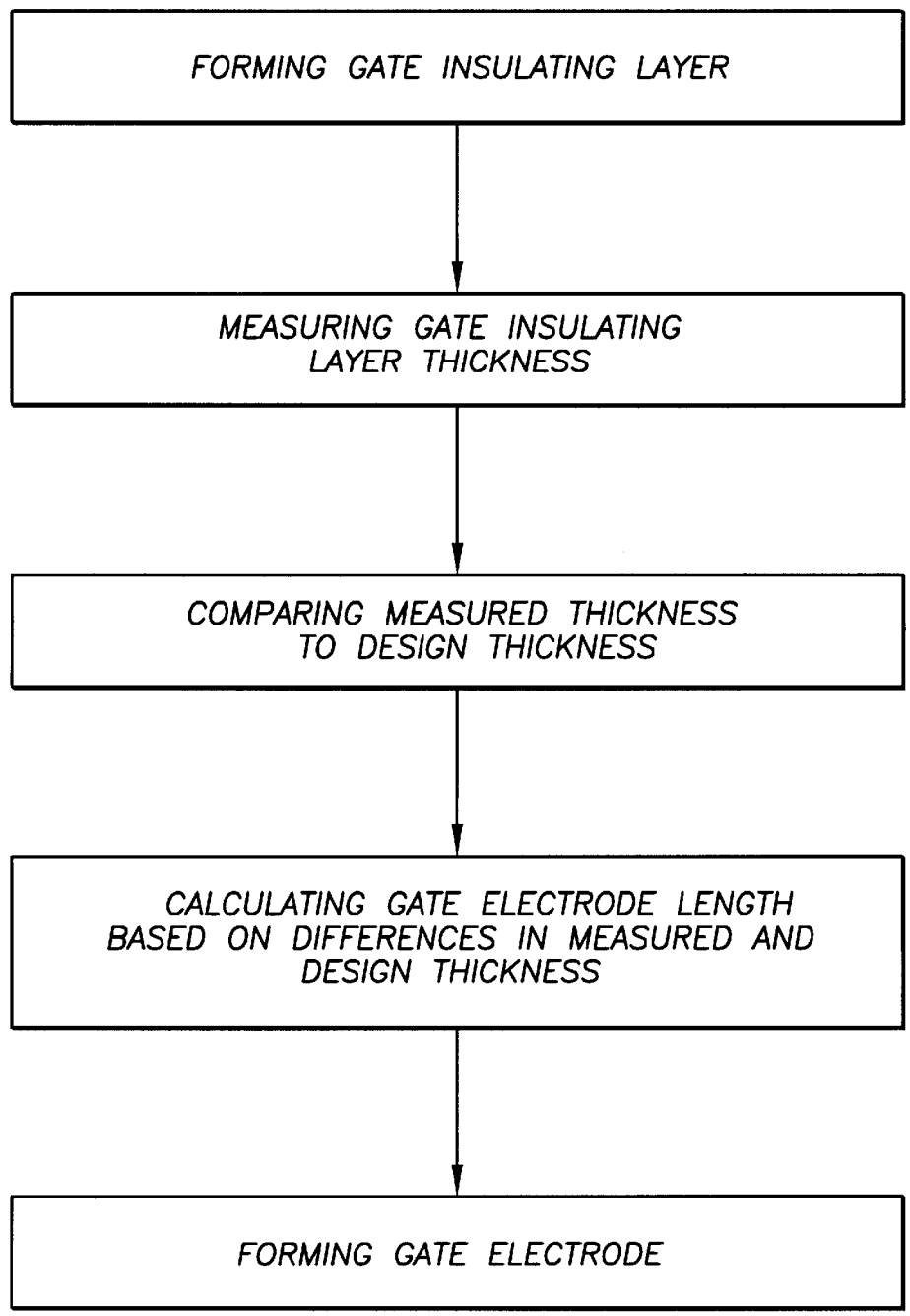
FIG. 2 shows a flow chart for a fabrication process in accordance with an exemplary embodiment of the present invention.

Referring to FIG. 2, the present process for manufacturing a semiconductor device forms a gate insulating layer on a substrate. A semiconductor device is designed to have a specific gate insulating layer thickness in order for the device to exhibit the desired properties. The gate insulating layer can be made of any suitable known material. Examples include oxide and nitride. The gate insulating layer can be formed by any suitable technique for the purposes of the present invention.

In the case of a silicon dioxide gate insulating layer, it has been found that a variation in thickness of 1 Å varies drive current strength by 12 $\mu a/\mu m$. Since even a monolayer of silicon dioxide has a thickness of about 3 Å, it can be seen that minor variations in the production of the gate insulating layer can affect the drive current strength of the device significantly.

After the gate insulating layer is formed, the thickness of the gate insulating layer is measured. This can be done in any suitable manner, for example using an ellipsometer. The measurement could be carried out in situ or at a separate station as desired. One measurement of the thickness of the gate insulating layer can be carried out for a substrate, or multiple measurements of the thickness at different locations on the substrate could be carried out as desired. When a plurality of substrates are processed in a single batch, one of the substrates can be measured as representative of the batch, or several or even all substrates can be measured if desired.

After the gate insulating layer thickness has been measured, one or more gate electrodes are formed over the gate insulating layer. The gate electrodes can be formed of any suitable material, including, for example, polysilicon. The gate electrodes may, for example, be formed by depositing a gate electrode layer and selectively removing portions of the gate electrode layer to form the gate electrode. This can be done, for example, using well-known deposition and photolithography techniques.

The relationship between the length of the channel (i.e. the distance between the source and drain regions) and the length of the gate electrode may vary depending upon the specific doping scheme that is followed for forming the source and drain regions. However, the relationship is essentially constant for a given doping scheme and therefore the channel length can be controlled easily and accurately by controlling the length of the gate electrode. For the purposes of this application, the "length" of the gate electrode will be used to define the dimension of the gate electrode in the direction parallel to the channel length. Since present gate electrode formation techniques permit very precise control over the dimensions of the gate electrodes, the dimensions of the gate electrode can be controlled to modify the channel length in the semiconductor device to take into account any variations from the design value in the thickness of the gate insulating layer. In the case where multiple thickness measurements are taken on a single substrate, the position of the gate electrodes with respect to the positions of measurement can be taken into account when the length of a given gate electrode is determined.

In one example of a typical process for forming the gate electrodes, a photoresist layer is applied over the gate electrode layer. The photoresist layer is patterned and exposed. The exposed photoresist is removed and the portions of the gate electrode layer no longer protected by the photoresist are removed, for example, by etching. This exemplary process is advantageous for the present invention in that the dimensions of the gate electrode can be controlled quite precisely, on the order of about 0.001 microns.

The variation in the final drive strength with respect to a given change in gate electrode length can vary depending on the type of device formed (e.g. NMOS or PMOS) as well as the source/drain implants used (e.g. boron or arsenic). For a given device this relationship can be determined, for example, by measuring the drive current strength for a given electrode length over a range of gate electrode lengths. For example, it has been found that each 0.004 $\mu m$ variation in gate electrode length (and hence channel length) varies the final drive strength for an NMOS device by about 2 $\mu a/\mu m$. Thus, the patterning of the gate electrodes can be controlled to counteract variations in drive current strength resulting from deviation of the gate insulating layer thickness from the desired value.

As a further option for this process, it is possible to measure the patterning before etching of the gate electrode layer. This provides an opportunity to ensure that the desired dimensions are being provided for the gate electrodes. If the desired dimensions are not being provided, it is relatively simple to remove the developed photoresist and start the coating and patterning process again. In addition, some variation in the dimensions of the exposed photoresist can be accomplished by varying the exposure energy. For example increasing the energy of the exposure can result in a smaller electrode dimension and vice versa. Again, this can be controlled in a highly predictable manner.

After the gate electrode has been formed, further processing to complete the semiconductor device can be carried out. This can include, for example various dopant implanting and annealing steps. The process of the present invention can be carried out using any suitable equipment. The process is suitable for automated control. For example, the measured thickness of the gate insulating layer can be input to a control system that determines the difference between the measured and desired values, and controls the length of the gate electrode accordingly, for example by control of the patterning of a photoresist layer.

The process of the present invention is adaptable for a variety of process flows. For example, in the case of a CMOS device, the electrodes for the NMOS and PMOS could be formed separately. That is, the PMOS regions would be protected during the formation of the NMOS electrodes. The formation of the electrodes for the different channels could involve the formation of different gate insulating layers, if desired. It should be noted that the change in drive current strength with changing channel length for the PMOS generally will be lower than that for the NMOS.

EXAMPLE

By way of illustrative example, assume that a gate insulating layer of silicon dioxide is deposited on a substrate. The thickness of the gate insulating layer is measured. While the target thickness of the gate insulating layer is 59 Å, the actual thickness of the gate insulating layer is 56 Å. The resulting drive current strength would be 36 $\mu a/\mu m$ higher than desired (again drive current strength is directly proportional to capacitance, which is inversely proportional to thickness). Assuming that in the doping scheme to be used each 0.001 $\mu m$ change in gate electrode length results in a change in drive current strength of 2 $\mu a/\mu m$, a gate electrode length increase of 0.018 $\mu m$ (again drive current strength is inversely proportional to channel length and channel length depends on gate electrode length) would be needed to offset the 3 Å reduction in the gate oxide thickness and provide a semiconductor device having the desired drive current strength. This change in the gate electrode length can be accomplished, for example, by making the appropriate changes in the patterning of a photoresist formed over a gate electrode layer.

As noted above, the present invention is applicable to the fabrication of a variety of different devices where the advantages of controlled drive current strength are desired. Accordingly, the present invention is not limited to the particular examples described above, but rather should be understood to cover all aspects of the invention as fairly set forth in the attached claims. Various modifications, equivalent process and other structures to which the present invention may be applicable will be readily apparent to those of skill in the art upon review of the present specification. The claims are intended to cover such modifications and devices.

We claim:

1. A method of forming a semiconductor device, comprising:

providing a desired ratio of a gate insulating layer thickness to a gate electrode length;

forming the gate insulating layer over a substrate;

determining a thickness difference between the gate insulating layer thickness and a target gate insulating layer thickness;

using the desired ratio and thickness difference to determine the length of the gate electrode; and forming the gate electrode with the determined length over the gate insulating layer.

2. The method of claim 1, wherein the step of using the desired ratio further includes the step of using a target drive current strength to determine the gate electrode length.

3. The method of claim 2, further including the step of using a drive current strength variation range in determining the gate electrode length.

4. The method of claim 1, wherein the gate insulating layer is composed of silicon dioxide.

5. The method of claim 4, wherein the desired ratio is about 1:60, wherein the gate electrode length varies by sixty (60) angstroms for every angstrom of silicon dioxide layer thickness variation.

6. The method of claim 1, wherein the thickness difference is determined in situ using an ellipsometer.

7. The method of claim 1, wherein forming the gate electrode includes forming a polysilicon layer over the gate insulating layer and selectively removing portions of the polysilicon layer using a patterned photoresist layer to form the gate electrode.

8. The method of claim 7, wherein forming the gate electrode further includes measuring a dimension of an opening formed in the patterned photoresist layer used to form the gate electrode and comparing the measured dimension of the opening against a target value prior to selectively removing portions of the polysilicon layer to form the gate electrode.

9. The method of claim 8, wherein forming the gate electrode further includes removing the photoresist layer and patterning a new photoresist layer if the measured dimension of the photoresist layer opening exceeds the target value by a predetermined threshold.

10. A method of forming a semiconductor device, comprising:

providing a desired ratio of a gate insulating layer thickness to a gate electrode length of about 1:60;

forming the gate insulating layer of silicon dioxide over a substrate;

determining a thickness difference between the silicon dioxide layer thickness and a target silicon dioxide layer thickness;

using the desired ratio and thickness difference to determine the length of the gate electrode; and forming the gate electrode with the determined length over the silicon dioxide layer.

11. The method of claim 10, wherein the step of using the desired ratio further includes the step of using a target drive current strength to determine the gate electrode length that is selected from the range of 200–1000 $\mu a/\mu m$.

12. The method of claim 11, further including the step of using a drive current strength that is within the range of 30 $\mu a/\mu m$ from the target drive current in determining the gate electrode length.

13. The method of claim 12, wherein forming the gate electrode includes forming a polysilicon layer over the gate insulating layer and selectively removing portions of the polysilicon layer using a patterned photoresist layer to form the gate electrode.

* * * * *

UNITED STATES PATENT AND TRADEMARK OFFICE
CERTIFICATE OF CORRECTION

PATENT NO. : 6,228,663 B1
DATED : May 8, 2001
INVENTOR(S) : Gardner et al.

It is certified that error appears in the above-identified patent and that said Letters Patent is hereby corrected as shown below:

Column 2,
Line 39, "may understood" should read -- may be understood --.

Column 4,
Line 36, "0.004 μm" should read -- 0.001 $\mu$m --.

Column 6,
Line 27, "patterning" should read -- repatterning --.

Signed and Sealed this

Fourth Day of February, 2003

JAMES E. ROGAN
*Director of the United States Patent and Trademark Office*